United States Patent [19]
Rockwell

[11] Patent Number: 5,384,688
[45] Date of Patent: Jan. 24, 1995

[54] THREE-DIMENSIONAL CIRCUITS FOR DIGITIZER AND PEN-BASED COMPUTER SYSTEM PEN CURSORS

[75] Inventor: Lynn H. Rockwell, Mesa, Ariz.
[73] Assignee: CalComp Inc., Anaheim, Calif.
[21] Appl. No.: 27,642
[22] Filed: Mar. 8, 1993
[51] Int. Cl.6 ............................................. H05K 1/14
[52] U.S. Cl. .................... 361/736; 361/748; 361/767; 361/781; 174/260; 345/179
[58] Field of Search .............. 361/736, 748, 752, 761, 361/767, 781, 787, 796, 807, 808; 178/18–20; 340/707; 174/260, 261

[56] References Cited
U.S. PATENT DOCUMENTS

| | | | |
|---|---|---|---|
| 4,158,747 | 6/1979 | Muller et al. | 178/19 |
| 4,672,154 | 6/1987 | Rodgers et al. | 178/19 |
| 4,883,926 | 11/1989 | Baldwin | 178/18 |

Primary Examiner—Leo P. Picard
Assistant Examiner—Young Whang
Attorney, Agent, or Firm—Wm. F. Porter, Jr.; Donald Streck

[57] ABSTRACT

This is a pen cursor structure for a positional digitizing device such as a digitizing tablet or a pen-driven computer. It comprises a structure of an electrically insulating material having a plurality of areas for receiving and carrying electrical components, an inner structure having a plurality of electrical contacts disposed within the areas and a plurality of electrical traces interconnecting the plurality of electrical contacts. The structure is curved about a longitudinal axis to fit within an outer, hollow, pen-shaped housing.

17 Claims, 3 Drawing Sheets

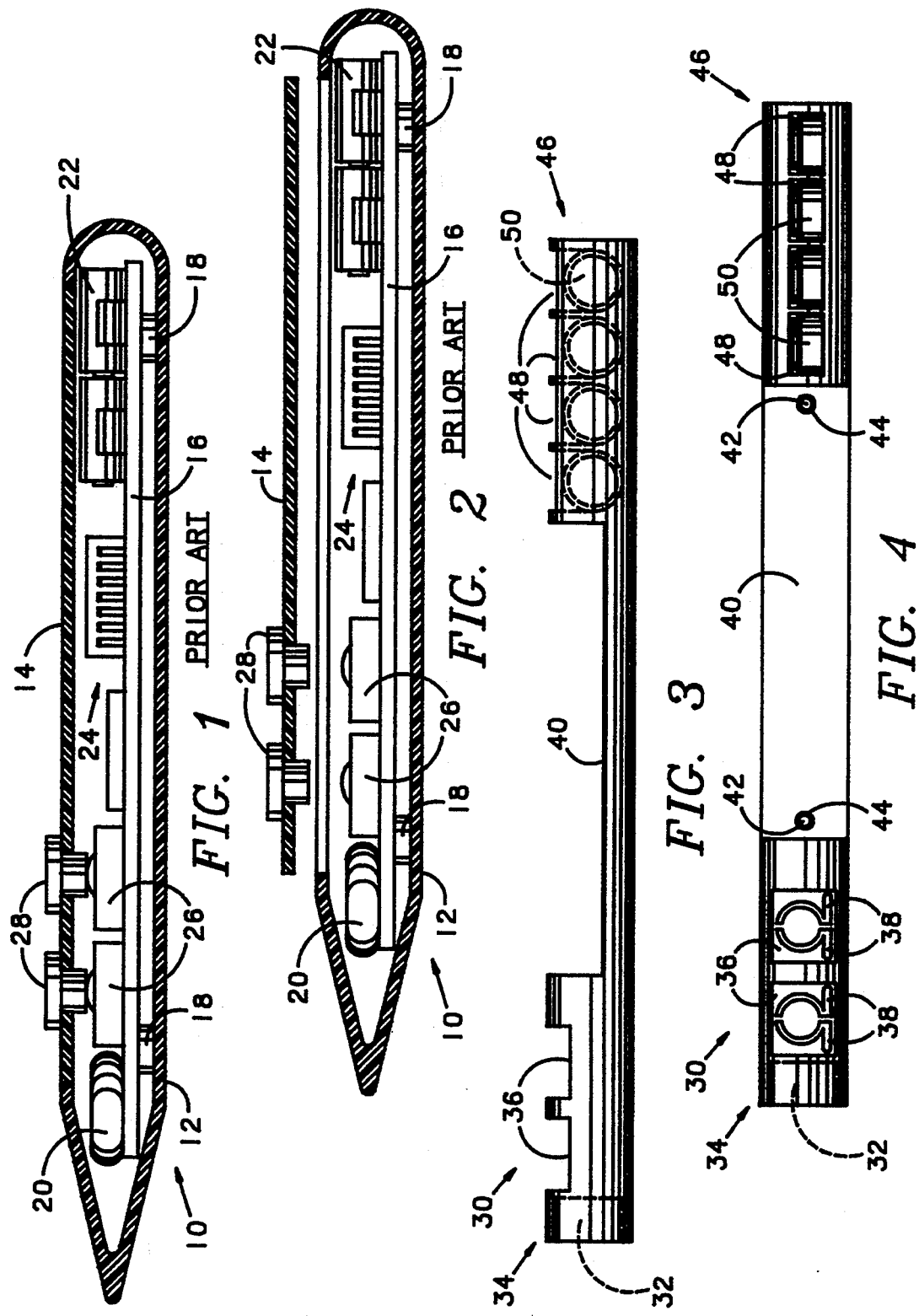

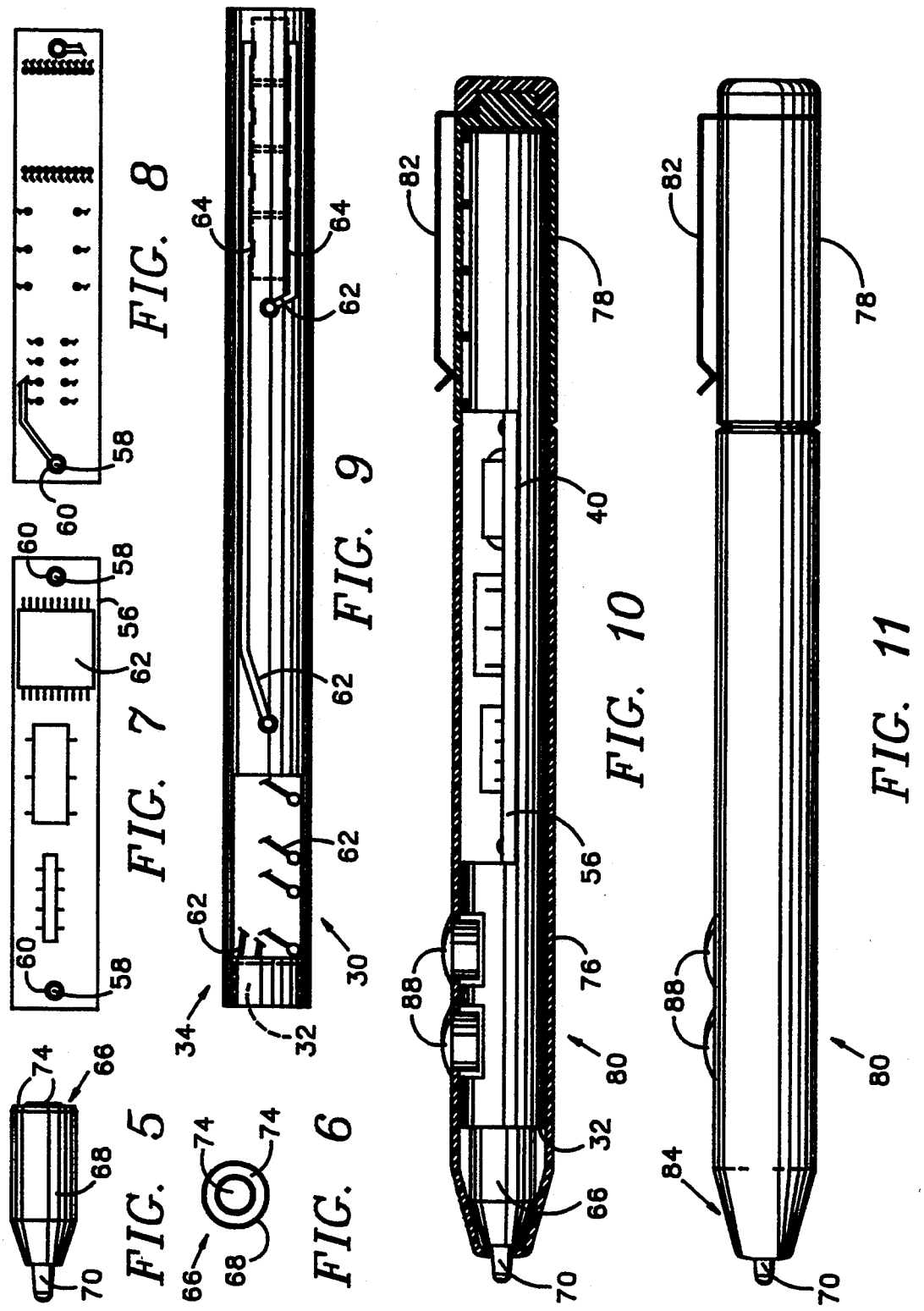

THREE-DIMENSIONAL CIRCUITS FOR DIGITIZER AND PEN-BASED COMPUTER SYSTEM PEN CURSORS

BACKGROUND OF THE INVENTION

This invention relates to cursors for digitizers and pen-based computers and, more particularly, to a pen cursor structure for a positional digitizing device comprising a structure of an electrically insulating material having a plurality of areas for receiving and carrying electrical components, said inner structure having a plurality of electrical contacts disposed within said areas and a plurality of electrical traces interconnecting said plurality of electrical contacts.

Pen-shaped cursors have been long known for use with digitizer tablets as an alternative to the so-called "puck" cursors. More recently, they have become the cursor of choice for so-called "pen-based" computer systems wherein the cursor is employed as the input device on a panel display screen. To more closely approximate the look and feel for a user of writing or drawing on a tablet, the most popular pen cursors are made as "cordless" devices requiring no physical connection between the cursor and the tablet.

Prior art pen cursors are constructed in the manner of the pen cursor 10 of FIGS. 1 and 2. There is a hollow plastic body 12 which can be opened as with an access panel 14. A printed circuit board 16 is mounted within the body 12 as on the standoffs 18 with screws (not shown). The required components are pre-mounted on the printed circuit board 16. Typically, there would be a signal sending or sensing coil 20, batteries 22 for power, electronic components 24, and one or more physical switches 26. The switches 26 are activated by the pressing of buttons 28 carried by the body 12 or access panel 14. Such construction has several drawbacks. For one, the pen cursor 10 in length and cross section is larger than desired for true "pen" sizing. For another, the assembly time and costs is greater than desired because of the labor intensive nature of such construction.

Wherefore, it is an object of this invention to provide a construction technique for pen cursors which results in a pen cursor which is pen-like in length and cross section.

It is another object of this invention to provide a construction technique for pen cursors which is easily assembled at low cost and labor intensity.

Other objects and benefits of the invention will become apparent from the detailed description which follows hereinafter when taken in conjunction with the drawing figures which accompany it.

SUMMARY

The foregoing objects have been attained by the pen cursor structure for a positional digitizing device of the present invention comprising an inner structure of an electrically insulating material having a plurality of areas for receiving and carrying electrical components, the inner structure having a plurality of electrical contacts disposed within the areas and a plurality of electrical traces interconnecting the plurality of electrical contacts.

In the preferred embodiment, the pen cursor structure additionally comprises, a plurality of first sockets for receiving and carrying power-supplying batteries formed in the inner structure; and, a portion of the plurality of electrical contacts being disposed within the first sockets. Preferably, at least a pair of the plurality of electrical contacts comprise a pair of switch contacts disposed in one of the plurality of areas; a hollow cylindrical pen-shaped outer covering is concentrically disposed over the inner structure; and, depressible button contact means are carried by the outer covering over the pair of switch contacts for shorting the pair of switch contacts when the button contact means is depressed by a user.

The preferred embodiment also includes a second socket concentrically disposed within a front end of the inner structure; a coil module removably disposed within the second socket, the coil module containing an electrical coil; and, contact means disposed in the second socket for electrically connecting the electrical coil to assigned connecting ones of the plurality of electrical traces. The preferred coil module is cylindrical in shape with the electrical coil concentrically disposed about a longitudinal axis thereof and there is an armature concentrically disposed within the electrical coil. Also, the coil module is tapered towards the front end; the outer covering is tapered about the coil module; and, the armature extends out from an end bore in the outer covering. Additionally, the first sockets are disposed adjacent a back end of the inner structure; the outer covering is disposed over a front portion of the inner structure not including the back end of the inner structure; and there is a cylindrical cap portion concentrically disposed over the back end of the inner structure to removably cover the first sockets.

Also in the preferred embodiment, another of the plurality of areas is a mounting pad; a printed circuit board carrying electrical components of a pen cursor is mounted on the mounting pad; and, the mounting pad contains ones of the plurality of electrical contacts connecting electrical connections of the printed circuit board to assigned connecting ones of the plurality of electrical traces.

DESCRIPTION OF THE DRAWINGS

FIG. 1 is a simplified side view cross sectional drawing of a prior art pen cursor with its access panel in place.

FIG. 2 is a simplified side view cross sectional drawing of a prior art pen cursor with its access panel lifted.

FIG. 3 is a side view drawing of the three-dimensional inner structure of a pen cursor according to the present invention.

FIG. 4 is a top view drawing of the three-dimensional inner structure of FIG. 3.

FIG. 5 is a side view drawing of the coil module of the present invention.

FIG. 6 is a back end view of the coil module of FIG. 5.

FIG. 7 is a top view drawing of the printed circuit board employed in the present invention.

FIG. 8 is a bottom view drawing of the printed circuit board of FIG. 7.

FIG. 9 is a bottom view drawing of the three-dimensional inner structure of FIG. 3.

FIG. 10 is a partially cut away side view of the three-dimensional inner structure with the printed circuit board and coil module attached mounted within the outer covering and cap.

FIG. 11 is a side view drawing of the assembled pen cursor of the present invention.

DESCRIPTION OF THE PREFERRED EMBODIMENT

Figure 13:
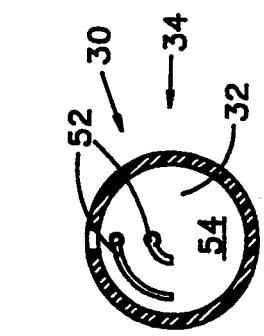
FIG. 13 is a cutaway front end view of the three-dimensional inner structure in the area of the socket which receives the coil module.

The heart of the present invention and the portion which makes the attaining of the objects feasible is the three-dimensional inner structure 30 best seen in FIGS. 3, 4, and 9. The inner structure 30 is molded of plastic so as to be insulating in nature and light in weight. As can be seen from the drawing figures, the inner structure 30 is generally cylindrical in shape. It is slightly smaller in length and cross section than an average pen so as to fit within a pen-sized outer covering to be described shortly. Certain electrical connections and interconnecting traces to be described are applied to the various surfaces of the inner structure 30 using printed circuit techniques well known to those skilled in the art. As such persons will readily recognize and appreciate, the inner structure 30 can be formed as shown and the electrical connections and interconnecting traces then applied. Alternatively, the electrical connections and interconnecting traces can be applied to or formed as part of a pre-finished blank and then the inner structure 30 formed therefrom by further molding processes. Both approaches are known in the art and form no part of the present invention per se. It is the finished structure itself which is the novel aspect of this invention.

Further to the construction of the inner structure 30, there is a socket 32 formed therein adjacent the front end 34 for a coil module soon to be described. One or more button contact areas 36 are formed on the periphery adjacent and slightly back from the front end 34 so as to be in a convenient position for pressing of associated buttons by a user's fingers when the final pen cursor is held in a normal manner. Each button contact area 36 contains a pair of electrical contacts 38 formed therein which form the contacts of a switch. The middle portion of the inner structure 30 is a flat mounting pad 40 onto which a small printed circuit board to be discussed shortly is mounted. For now, note that the mounting pad 40 has a pair of mounting holes 42 therein surrounded by electrical contacts 44. The back end 46 of the inner structure 30 contains a number of sockets 48 into which small lithium "hearing aid" type batteries 50 can be placed for providing power to the resultant pen cursor. As shown in FIG. 13, the socket 32 has a pair of electrical contacts 52 formed in the backwall 54 thereof.

Turning momentarily to FIGS. 7 and 8, there is a small printed circuit board 56 sized to fit on the mounting pad 40. The printed circuit board 56 has a pair of mounting holes 58 having electrical contacts 60 around them in the ends thereof. The holes 58 are spaced to be concentric with the mounting holes 42 when the printed circuit board 56 is placed on the mounting pad 40. Thus, when the printed circuit board 56 is secured in place with screws (not shown) threadedly engaged through the mounting holes 42, 58, the electrical contacts 44, 60 are electrically connected together. The printed circuit board 56 only contains those few electrical components such as the integrated circuit 62 which are not otherwise provided for. Thus, it should be appreciated that the printed circuit board 56 of this invention does not contribute any major labor intensity to the assembly of the final product.

Turning now to FIG. 9, it can be seen that there are electrical traces 62 formed on the inner structure 30 interconnecting battery contacts 64 within the battery sockets 48 with, inter alia, the electrical contacts 44, the switch contacts 38, and the contacts 52 within the socket 32.

Figure 12:
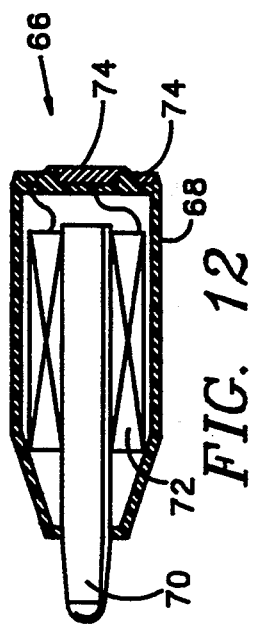
FIG. 12 is a cutaway side view drawing of the coil module.

The final working component is the coil module 66 of FIGS. 5, 6, and 12. The coil module 66 comprises a case 68 of a diameter to fit within the socket 32. The case 68 contains a concentrically disposed armature 70 having the working coil 72 disposed concentrically therearound. The armature 70 can be of plastic, metal, or even a working ball point pen or pencil, if desired. The coil 72 is electrically connected to a pair of circular contacts 74.

The inner structure 30 is shown in its assembled state within a pen-shaped outer covering 76 and pen type cap 78 in FIG. 10. As can be seen, the printed circuit board 56 is mounted on the mounting pad 40 and the coil module 66 is pressed into the socket 32. With the batteries 50 in place within their sockets 48, there is electrical continuity throughout the inner structure 30 in the manner described above.

With respect to the outer covering 76 and the cap 78, as can be appreciated from the drawing of FIG. 11 with particularity, the pen cursor 80 of this invention is very pen-like in size, shape, appearance, and features. To replace the batteries 50, the cap 78 is merely slid off the back end 46 in the manner of a pen. The cap 78 is even provided with a pocket clip 82. The "writing" end at 84 is tapered in the manner of a pen and has the armature 70 extending therefrom as a more definite point of contact. As mentioned earlier, the armature 70 can actually be a ball point pen, if desired.

Figure 14:
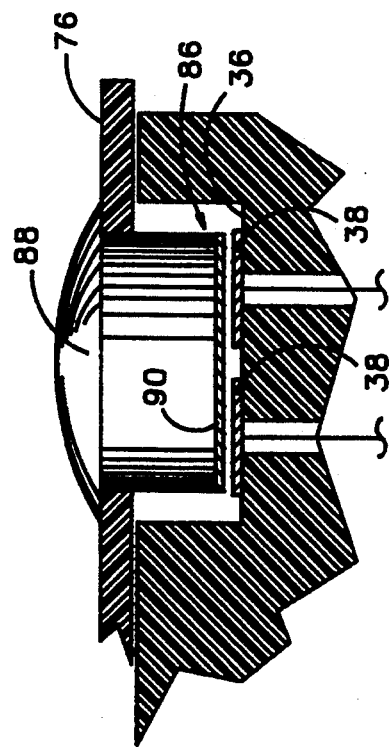
FIG. 14 is an enlarged cutaway side view drawing of a button contact as carried by the outer covering disposed adjacent contacts on the three-dimensional inner structure connected thereby shown with the button not depressed.
Figure 15:
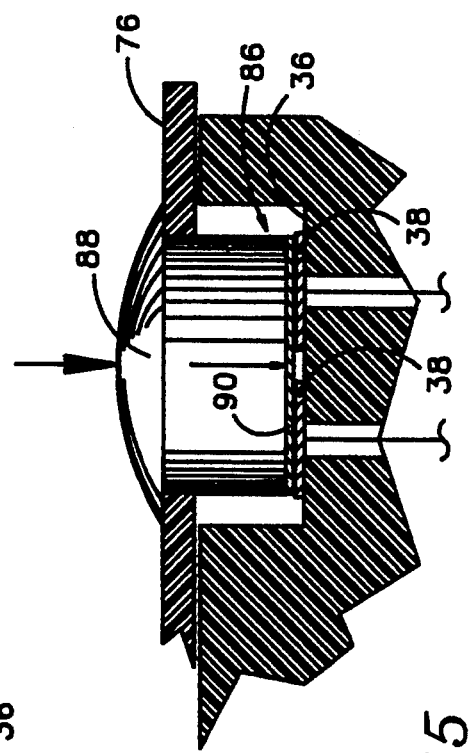
FIG. 15 is an enlarged cutaway side view drawing of a button contact as carried by the outer covering disposed adjacent contacts on the three-dimensional inner structure connected thereby shown with the button depressed.

As best seen from the enlarged drawings of FIGS. 14 and 15 viewed in conjunction with the overall drawing of FIG. 10, the user actuatable switches 86 of the cursor 80 comprise actuating buttons 88 carried by the outer covering 76. It should be understood that the drawings of the switches 86 and their components contained herein are not to scale in the interest of simplicity. In an actual implementation, it is most likely that the buttons 88 would be of the so-called "membrane" variety for ease of manufacture and small size leading to ease of manufacture and assembly without the need for large clearances as would be the case if buttons as depicted were employed. Functionally, the buttons 88 are depressible members preferably having a tactile feel which carry an electrical shorting member 90. The shorting members 90 are disposed parallel to but spaced from the contacts 38 on the contact areas 36 as depicted in FIG. 14. A slight pressure on the button 88 causes the shorting member 90 to be pressed into electrical contact with the associated pair of contacts 38 thereby closing the "switch" 86.

Wherefore, having thus described the present invention,

What is claimed is:

1. A pen cursor structure for a positional digitizing device comprising:
   (a) an inner structure of an electrically insulating material having a plurality of areas for receiving and carrying electrical components, said inner structure having a plurality of electrical contacts disposed within said areas and a plurality of electrical traces interconnecting said plurality of electrical contacts;
   (b) at least a pair of said plurality of electrical contacts comprising a pair of switch contacts disposed in one of said plurality of areas;
   (c) a hollow cylindrical pen-shaped outer covering concentrically disposed over said inner structure; and,
   (d) depressible button contact means carried by said outer covering over said pair of switch contacts for shorting said pair of switch contacts when said button contact means is depressed by a user.

2. The pen cursor structure for a positional digitizing device of claim 1 and additionally comprising:
   a) a plurality of first sockets for receiving and carrying power-supplying batteries formed in said inner structure; and,
   b) a portion of said plurality of electrical contacts being disposed within said first sockets.

3. The pen cursor structure for a positional digitizing device of claim 2 and additionally comprising:
   a) a second socket concentrically disposed within a front end of said inner structure;
   b) a coil module removably disposed within said second socket, said coil module containing an electrical coil; and,
   c) contact means disposed in said second socket for electrically connecting said electrical coil to assigned connecting ones of said plurality of electrical traces.

4. The pen cursor structure for a positional digitizing device of claim 3 wherein:
   a) said coil module is cylindrical in shape with said electrical coil concentrically disposed about a longitudinal axis thereof; and additionally comprising,
   b) an armature concentrically disposed within said electrical coil.

5. The pen cursor structure for a positional digitizing device of claim 4 wherein:
   a) said coil module is tapered towards said front end;
   b) said outer covering is tapered about said coil module; and,
   c) said armature extends out from an end bore in said outer covering.

6. The pen cursor structure for a positional digitizing device of claim 5 wherein:
   a) said first sockets are disposed adjacent a back end of said inner structure;
   b) said outer covering is disposed over a front portion of said inner structure not including said back end of said inner structure; and additionally comprising,
   c) a cylindrical cap portion concentrically disposed over said back end of said inner structure to removably cover said first sockets.

7. The pen cursor structure for a positional digitizing device of claim 1 wherein:
   a) another of said plurality of areas is a mounting pad; and additionally comprising,
   b) a printed circuit board carrying electrical components of a pen cursor mounted on said mounting pad; and wherein,
   c) said mounting pad contains ones of said plurality of electrical contacts connecting electrical connections of said printed circuit board to assigned connecting ones of said plurality of electrical traces.

8. A pen cursor structure for a positional digitizing device comprising:
   a) a cylindrical inner structure of an electrically insulating material having a plurality of areas for receiving and carrying electrical components and a plurality of first sockets for receiving and carrying power-supplying batteries formed therein, Said inner structure having a plurality of electrical contacts disposed within said areas and said first sockets and a plurality of electrical traces interconnecting said plurality of electrical contacts;
   b) at least a pair of said plurality of electrical contacts comprising a pair of switch contacts disposed in one of said plurality of areas;
   c) a hollow cylindrical pen-shaped outer covering concentrically disposed over said inner structure; and,
   d) depressible button contact means carried by said outer covering over said pair of switch contacts for shorting said pair of switch contacts when said button contact means is depressed by a user.

9. The pen cursor structure for a positional digitizing device of claim 8 and additionally comprising:
   a) a second socket concentrically disposed within a front end of said inner structure;
   b) a coil module removably disposed within said second socket, said coil module containing an electrical coil; and,
   c) contact means disposed in said second socket for electrically connecting said electrical coil to assigned connecting ones of said plurality of electrical traces.

10. The pen cursor structure for a positional digitizing device of claim 9 wherein:
    a) said coil module is cylindrical in shape with said electrical coil concentrically disposed about a longitudinal axis thereof; and additionally comprising,
    b) an armature concentrically disposed within said electrical coil.

11. The pen cursor structure for a positional digitizing device of claim 10 wherein:
    a) said coil module is tapered towards said front end;
    b) said outer covering is tapered about said coil module; and,
    c) said armature extends out from an end bore in said outer covering.

12. The pen cursor structure for a positional digitizing device of claim 8 wherein:
    a) another of said plurality of areas is a mounting pad; and additionally comprising,
    b) a printed circuit board carrying electrical components of a pen cursor mounted on said mounting pad; and wherein,
    c) said mounting pad contains ones of said plurality of electrical contacts connecting electrical connections of said printed circuit board to assigned connecting ones of said plurality of electrical traces.

13. The pen cursor structure for a positional digitizing device of claim 8 wherein:
    a) said first sockets are disposed adjacent a back end of said inner structure;

b) said outer covering is disposed over a front portion of said inner structure not including said back end of said inner structure; and additionally comprising, c) a cylindrical cap portion concentrically disposed over said back end of said inner structure to removably cover said first sockets.

14. A pen cursor for a positional digitizing device comprising:
   a) a cylindrical inner structure of an electrically insulating material, said inner structure including,
   a1) a plurality of first sockets for receiving and carrying power-supplying batteries formed therein at a back end thereof,
   a2) a second socket concentrically formed into a front end thereof,
   a3) a mounting pad formed therein between said front end and said back end, and
   a4) a switch contact area formed therein between said mounting pad and said front end;
   b) a plurality of first electrical contacts disposed within said first sockets;
   c) a plurality of second electrical contacts disposed within said second socket;
   d) a plurality of third electrical contacts disposed on said mounting pad;
   e) a pair of switch contacts disposed on said switch contact area;
   f) a plurality of electrical traces interconnecting said plurality of first electrical contacts, said plurality of second electrical contacts, said plurality of third electrical contacts, and said pair of switch contacts;
   g) a plurality of batteries disposed in respective ones of said first sockets in electrical contact with said first electrical contacts;
   h) a coil module removably disposed within said second socket, said coil module containing an electrical coil in electrical contact with said plurality of second electrical contacts;
   i) a printed circuit board carrying electrical components of a pen cursor mounted on said mounting pad with said electrical components in electrical contact with said plurality of third electrical contacts;
   j) a hollow cylindrical pen-shaped outer covering concentrically disposed over said inner structure; and,
   k) depressible button contact means carried by said outer covering over said pair of switch contacts for shorting said pair of switch contacts when said button contact means is depressed by a user.

15. The pen cursor for a positional digitizing device of claim 14 wherein:
   a) said coil module is cylindrical in shape with said electrical coil concentrically disposed about a longitudinal axis thereof; and additionally comprising,
   b) an armature concentrically disposed within said electrical coil.

16. The pen cursor for a positional digitizing device of claim 15 wherein:
   a) said coil module is tapered towards said front end;
   b) said outer covering is tapered about said coil module; and,
   said armature extends out from an end bore in said outer covering.

17. The pen cursor for a positional digitizing device of claim 14 wherein:
   a) said outer covering is disposed over a front portion of said inner structure not including said back end of said inner structure; and additionally comprising,
   b) a cylindrical cap portion concentrically disposed over said back end of said inner structure to removably cover said first sockets.

* * * * *